United States Patent
Younger et al.

(10) Patent No.: US 11,245,238 B2
(45) Date of Patent: Feb. 8, 2022

(54) TOOL FOR SHAPING CONTACT TAB INTERCONNECTS AT A CIRCUIT CARD EDGE

(71) Applicant: INTERNATIONAL BUSINESS MACHINES CORPORATION, Armonk, NY (US)

(72) Inventors: Timothy P. Younger, Rochester, MN (US); Theron L. Lewis, Rochester, MN (US); James D. Bielick, Pine Island, MN (US); Jennifer Bennett, Rochester, MN (US); David J. Braun, St. Charles, MN (US); Tim Bartsch, Stewartville, MN (US); John R. Dangler, Rochester, MN (US); Stephen M. Hugo, Stewartville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 476 days.

(21) Appl. No.: 16/157,731

(22) Filed: Oct. 11, 2018

(65) Prior Publication Data
US 2020/0119507 A1   Apr. 16, 2020

(51) Int. Cl.
*H01R 43/16* (2006.01)
*H01R 43/22* (2006.01)
(Continued)

(52) U.S. Cl.
CPC .............. *H01R 43/16* (2013.01); *H01R 43/22* (2013.01); *G06F 13/385* (2013.01);
(Continued)

(58) Field of Classification Search
CPC ...... H01R 43/16; H01R 43/22; H01R 12/721; H01R 12/89; H05K 3/225;
(Continued)

(56) References Cited

U.S. PATENT DOCUMENTS

| 4,503,608 A | 3/1985 | Evans |
|---|---|---|
| 6,991,521 B2 | 1/2006 | Hagan et al. |
| (Continued) | | |

FOREIGN PATENT DOCUMENTS

| CN | 2439349 Y | 7/2001 |
|---|---|---|
| CN | 204772019 U | 11/2015 |
| (Continued) | | |

OTHER PUBLICATIONS

Machine Translation of Japanese Patent Publication, JP 2009-4228, Apr. 2021. (Year: 2021).*

*Primary Examiner* — A. Dexter Tugbang
(74) *Attorney, Agent, or Firm* — Tihon Poltavets, Esq.; Kevin P. Radigan, Esq.; Heslin Rothenberg Farley & Mesiti P.C.

(57) ABSTRACT

A tool is provided for shaping contact tab interconnects at a circuit card edge. The tool includes a base member with a slot to receive a circuit card edge. The slot is sized such that the edge of the circuit card is slidable lengthwise within the slot. The tool further includes shaping dowels disposed within the base member, including at least two shaping dowels that define a set of adjacent shaping dowels extending at an angle relative to each other. The set of adjacent shaping dowels are exposed, at least in part, within the slot so that with lengthwise sliding of the edge of the circuit card within the slot, the edge of the circuit card contacts and slides across the set of adjacent shaping dowels rounding off, at least in part, ends of the contact tab interconnects at the edge of the circuit card.

10 Claims, 9 Drawing Sheets

(51) Int. Cl.
  *G06F 13/38* (2006.01)
  *H01R 12/72* (2011.01)
  *H01R 12/89* (2011.01)
  *H05K 3/22* (2006.01)
  *H05K 1/11* (2006.01)

(52) U.S. Cl.
  CPC .......... *H01R 12/721* (2013.01); *H01R 12/89* (2013.01); *H05K 1/117* (2013.01); *H05K 3/225* (2013.01); *H05K 2201/09154* (2013.01); *H05K 2203/0195* (2013.01); *Y10T 29/49208* (2015.01)

(58) Field of Classification Search
  CPC .......... H05K 2203/0195; H05K 1/117; H05K 2201/09154; Y10T 29/49208; G06F 13/385
  See application file for complete search history.

(56) References Cited

U.S. PATENT DOCUMENTS

| | | | |
|---|---|---|---|
| 7,422,486 B2 * | 9/2008 | Hoff .................. | G06F 13/385 439/660 |
| 7,544,252 B1 | 6/2009 | Scea et al. | |
| 7,913,379 B2 | 3/2011 | Bodenweber et al. | |
| 2007/0105448 A1 * | 5/2007 | Ju ..................... | H01R 12/721 439/636 |

FOREIGN PATENT DOCUMENTS

| | | | |
|---|---|---|---|
| CN | 205465553 U | | 8/2016 |
| JP | 2009004228 A | * | 1/2009 |
| JP | 2009-178821 A | | 8/2009 |

* cited by examiner

FIG. 6B

TOOL FOR SHAPING CONTACT TAB INTERCONNECTS AT A CIRCUIT CARD EDGE

BACKGROUND

In many computing product applications, circuit cards, such as printed circuit cards or boards, form part of the product. For instance, any of a variety of circuit cards might form part of a computing product, including memory cards, such as dual in-line memory modules (DIMMs), input/output cards, such as Peripheral Component Interconnect Express (PCIe) cards, etc. These circuit cards typically include metallized contact tabs or contact tab interconnects extending to an edge. The contact tab interconnects might include one or more metals, such as gold or palladium, and can be relatively hard contact tabs extending to the circuit card edge. Occasionally, a circuit card manufacturer will produce cards with an incorrect lead-in chamfer and/or rough metal plating at the mating circuit card edge, which can cause connector contact damage during mating of the circuit card with a corresponding socket or connector of a motherboard. As a result, such circuit cards either have to be returned to the manufacturer for re-working, or need to be discarded, resulting in loss of product and time.

SUMMARY

The shortcomings of the prior art are overcome and additional advantages are provided through the provision, in one aspect, of a tool to facilitate shaping contact tab interconnects at a circuit card edge. The tool includes a base member with a slot to receive an edge of a circuit card. The slot is sized such that the edge of the circuit card is slidable lengthwise within the slot, and the circuit card includes contact tab interconnects extending to the edge on at least one side of the circuit card. Further, the tool includes shaping dowels disposed within the base member, including at least two shaping dowels that define a set of adjacent shaping dowels extending at an angle relative to each other. The set of adjacent shaping dowels are exposed, at least in part, within the slot in the base member. In operation, with lengthwise sliding of the edge of the circuit card within the slot of the base member, the edge of the circuit card contacts and slides across the set of adjacent shaping dowels to round off, at least in part, ends of the contact tab interconnects at the edge of the circuit card.

In another aspect, a method of fabricating a tool to facilitate shaping contact tab interconnects at a circuit card edge is provided. The method includes providing a base member with a slot to receive an edge of the circuit card, where the slot is sized such that the edge of the circuit card is slidable lengthwise within the slot, and the circuit card includes contact tab interconnects extending to the edge on at least one side of the circuit card. The method also includes disposing shaping dowels within the base member, with at least two shaping dowels defining a set of adjacent shaping dowels extending at an angle relative to each other. The set of adjacent shaping dowels are exposed, at least in part, within the slot in the base member. In operation, with lengthwise sliding of the edge of the circuit card within the slot of the base member, the edge of the circuit card contacts and slides across the set of adjacent shaping dowels to round off, at least in part, ends of the contact tab interconnects at the edge of the circuit card.

In a further aspect, a method of shaping contact tab interconnects at a circuit card edge is provided. The method includes using a tool to shape the contact tab interconnects at the circuit card edge. The tool includes a base member with a slot to receive an edge of a circuit card, where the slot is sized such that the edge of the circuit card is slidable lengthwise within the slot, and the circuit card includes contact tab interconnects extending to the edge on at least one side of the circuit card. The tool also includes shaping dowels disposed within the base member. The shaping dowels include at least two shaping dowels that define a set of adjacent shaping dowels extending at an angle relative to each other. The adjacent shaping dowels are exposed, at least in part, within the slot in the base member. Using the tool includes placing the edge of the circuit card within the slot in the base member of the tool, and applying pressure to the circuit card while sliding the circuit card lengthwise within the slot so that the edge of the circuit card contacts and slides across the shaping dowels to round off, at least in part, ends of the contact tab interconnects at the edge of the circuit card.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known materials, systems, devices, fabrication techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note that reference is made below to the drawings, wherein the same or similar reference numbers used throughout different figures designate the same or similar components. Note further that numerous inventive aspects and features are disclosed herein, and unless inconsistent, each disclosed aspect or feature is combinable with any other disclosed aspect or feature as desired for a particular application of, for instance, a tool to facilitate shaping contact tab interconnects at a circuit card edge.

Figure 1:
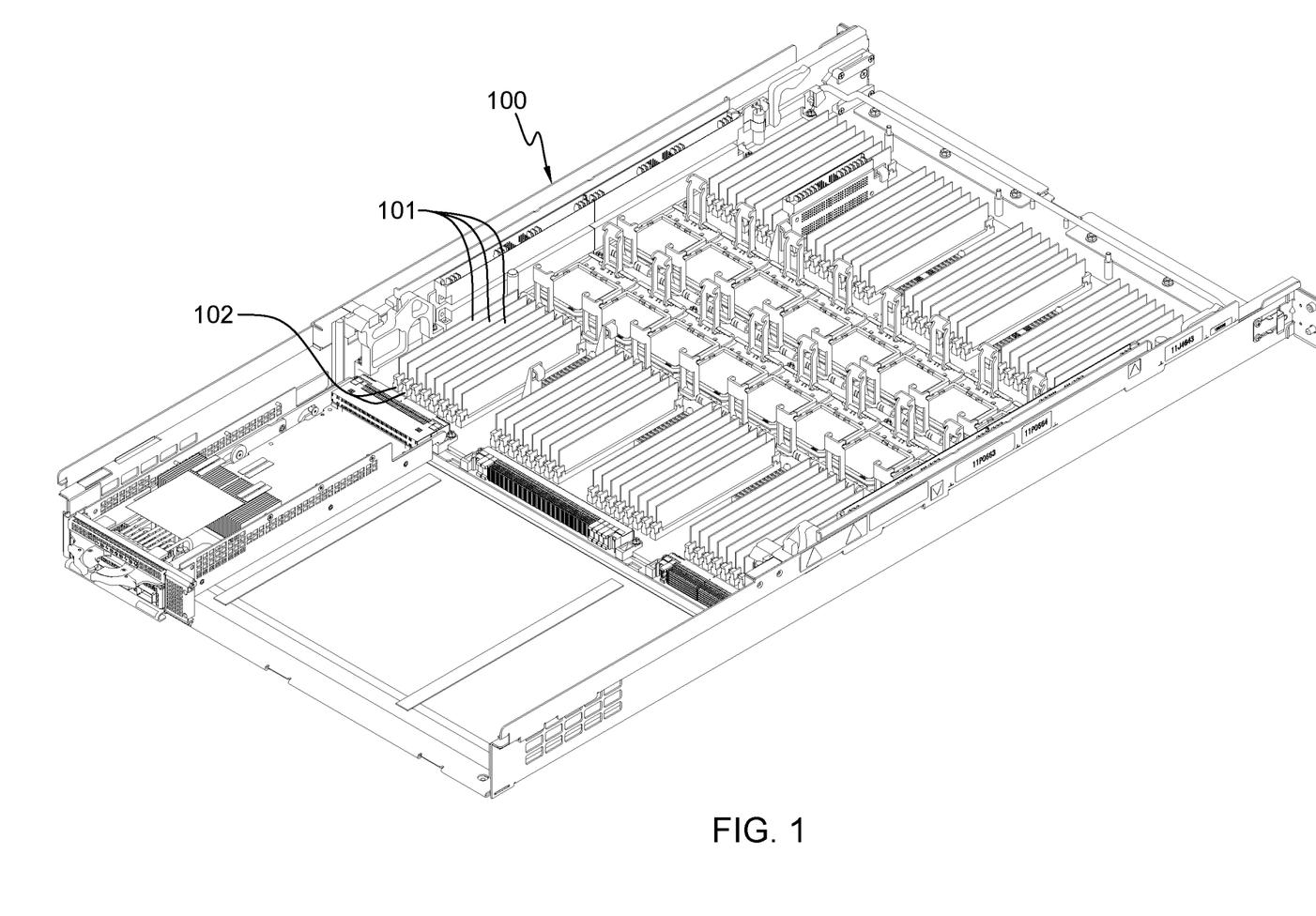
FIG. 1 depicts one embodiment of a partially assembled computing product, system, subsystem, etc., which includes multiple circuit cards utilizing contact tab interconnects at a connection edge that can be shaped using a tool, in accordance with one or more aspects of the present invention.

By way of example only, FIG. 1 depicts one embodiment of a computing system, subsystem, node, product, etc., 100, which includes multiple components including multiple circuit cards 101, such as memory cards, operatively positioned within respective sockets or motherboard connectors 102 of the computing system 100. As one particular example, circuit cards 101 could be dual in-line memory modules (DIMMs), with multiple rows of memory modules shown within computing system 100, again by way of example only.

Figure 2:
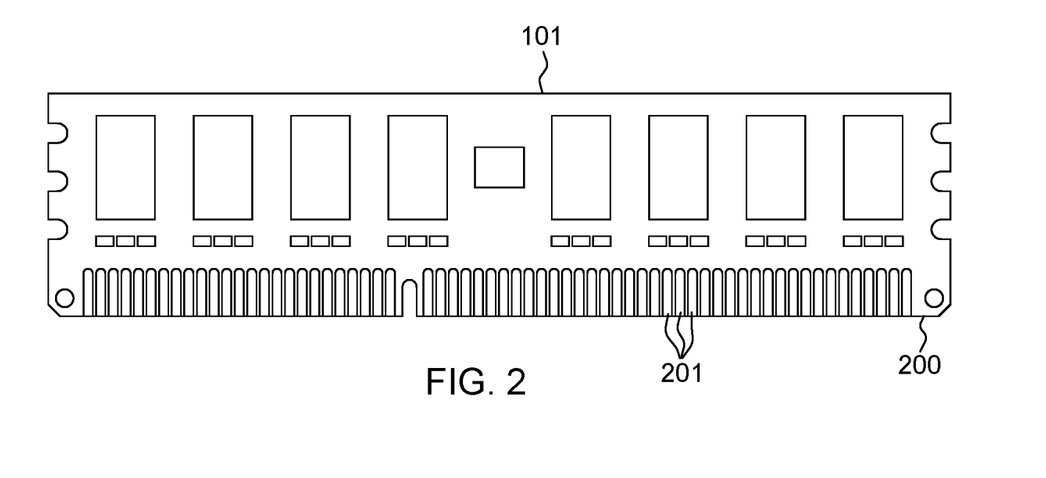
FIG. 2 depicts one embodiment of a circuit card with contact tab interconnects on one side thereof that can be shaped using a tool, in accordance with one or more aspects of the present invention.

FIG. 2 depicts one embodiment of circuit card 101, such as a dual in-line memory module (DIMM) card, with an edge 200 having contact tab interconnects 201 extending to edge 200, for instance, to facilitate operatively connecting to the memory chips of the DIMM card. These contact tab interconnects 201, or more generally, contact tabs, provide operative connection of circuit card 101 within the computing system through a respective socket or connector 102 (FIG. 1), in one or more embodiments. Further, by way of example, circuit card 101 can include contact tab interconnects 201 at edge 200 on both opposite main sides of the card, depending on the card application.

Figure 3:
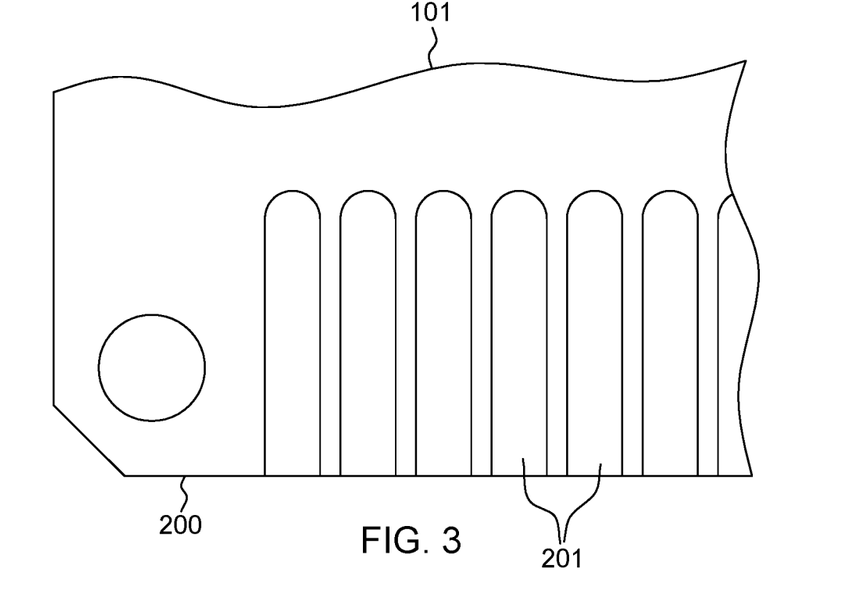
FIG. 3 is an enlarged partial depiction of one embodiment of a circuit card with contact tab interconnects extending to an edge of the circuit card, and which can be shaped using a tool, in accordance with one or more aspects of the present invention.

FIG. 3 is an enlarged partial depiction of one embodiment of circuit card 101 with contact tab interconnects 201 extending to edge 200. As noted initially, occasionally circuit cards are produced which have the wrong lead-in chamfers at edge 200, and/or rough metal plating ends that could cause damage during mating of the circuit card with the corresponding socket or connector system. For instance, a circuit card chamfer with the wrong contact tab angle could cause damage to the connector contacts within the socket when inserted into the system's mating socket. In one or more implementations, the connector contacts within the socket could be spring-loaded connector contacts which, without the proper chamfer on the contact tabs at the circuit card edge, can be damaged by the contact tabs with insertion of the circuit card into the socket. The result could be a poor or intermittent electrical contact of the circuit card with the socket contacts.

Advantageously, disclosed herein are tools and methods which allow, for instance, the contact tab chamfer at the edge of a circuit card to be modified without requiring sending the circuit card back to a circuit board vendor, or scrapping the circuit card. Further, the tool disclosed herein can be used in combination with applying a lubricant and/or corrosion inhibitor to interconnects at the edge of the circuit card, prior to insertion of the circuit card into the socket or connector system to facilitate operation of the computing system.

Generally stated, disclosed herein are a tool, method of fabricating the tool, and method of using the tool, to facilitate shaping contact tab interconnects extending to a circuit card edge. The tool includes a base member with a slot to receive an edge of a circuit card. The slot is sized such that the edge of the circuit card is slidable lengthwise within the slot, and the circuit card includes contact tab interconnects extending to the edge on at least one side of the circuit card. The tool also includes shaping dowels disposed within the base member, including at least two shaping dowels that are adjacent to each other and define a set of adjacent shaping dowels extending at an angle relative to each other. The set of adjacent shaping dowels are exposed, at least in part, within the slot in the base member. In operation, with lengthwise sliding of the edge of the circuit card within the slot of the base member, the edge of the circuit card contacts and slides across the set of adjacent shaping dowels to round off, at least in part, ends of the contact tab interconnects at the edge of the circuit card.

In one or more implementations, shaping dowels of the set of adjacent shaping dowels are oriented within the base member such that, in operational use of the tool, with lengthwise sliding of the edge of the circuit card within the slot of the base member across the set of adjacent shaping dowels, the set of adjacent shaping dowels facilitate chamfering the contact tab interconnects at the edge of the circuit card.

In one or more embodiments, the at least two shaping dowels of the set of adjacent shaping dowels are cylindrical rods oriented in different directions within the base member. In one or more embodiments, the shaping dowels of the set of adjacent shaping dowels each have a smooth surface exposed within the slot in the base member. In one or more implementations, the shaping dowels of the set of adjacent shaping dowels are in physical contact or are in close proximity to each other within the base member, so that the set of adjacent shaping dowels tends to capture and guide the circuit card edge as it crosses the dowels.

In one or more embodiments, the shaping dowels of the set of adjacent shaping dowels are positioned and oriented such that a first shaping dowel contacts the edge of the circuit card at a first side of the circuit card with lengthwise sliding of the edge of the circuit card within the slot in the base member, and a second shaping dowel contacts the edge of the circuit card at a second side of the circuit card with lengthwise sliding of the edge of the circuit card within the slot in the base member, where the first and second sides are opposite sides of the circuit card.

In certain implementations, the circuit card can include contact tabs or contact tab interconnects on both opposite sides of the circuit card, and the tool can be used to simultaneously provide an appropriate rounding off, at least in part, of ends of the contact tab interconnects at the circuit card edge on the opposite sides of the circuit card.

In one or more implementations, the base member is an elongate structure with a length greater than a length of the circuit card, and the base member includes a flat upper surface, with the slot being disposed in the flat upper surface of the base member.

In certain embodiments, the base member has a rounded lower surface, and the base member is sized and configured to be held by an operator when the tool is in use, with the tool being a hand-held tool.

In one or more implementations, the shaping dowels disposed within the base member can include a first pair of adjacent shaping dowels and a second pair of adjacent shaping dowels. For instance, shaping dowels of the first pair of shaping dowels can be oriented within the base member at a first angle relative to each other, and shaping dowels of the second pair of adjacent shaping dowels can be oriented in the base member at a second angle relative to each other, where the first angle and the second angle are different angles. In certain embodiments, the first and second pairs of shaping dowels can be used in combination to stepwise round-off, at least in part, ends of the contact tab interconnects at the edge of the circuit card.

By way of specific example, FIGS. 4A-4D depict one embodiment of a tool 400 to facilitate shaping contact tab interconnects extending to a circuit card edge, in accordance with one or more aspects of the present invention.

Referring collectively to FIGS. 4A-4D, tool 400 includes a base member 410 with a slot 412, sized and configured to receive an edge of a circuit card. For instance, the slot size and configuration can be such that the edge of the circuit card is slidable lengthwise within the slot, such as from one end 411 to an opposite end 412 of base member 410. As illustrated, base member 410 can be configured as an elongate member designed to be hand-held by an operator when in use. In the embodiment depicted, tool 400 includes a flat upper surface 413 and a curved or rounded lower surface 414. Base member 410 of tool 400 can be configured of any desirable material of sufficient rigidity to facilitate the shaping operation discussed herein. In one or more embodiments, the material selected for base member 410 is such as to not damage a circuit card being slid lengthwise within slot 415 of base member 410 when in use, should the card contact the inner wall of base member 410 defining slot 415. Note also that, in one or more embodiments, slot 415 is of minimal depth, since the tool is designed to shape or form the contact tab interconnects at the edge of the circuit card.

Figures 4A, 4B:
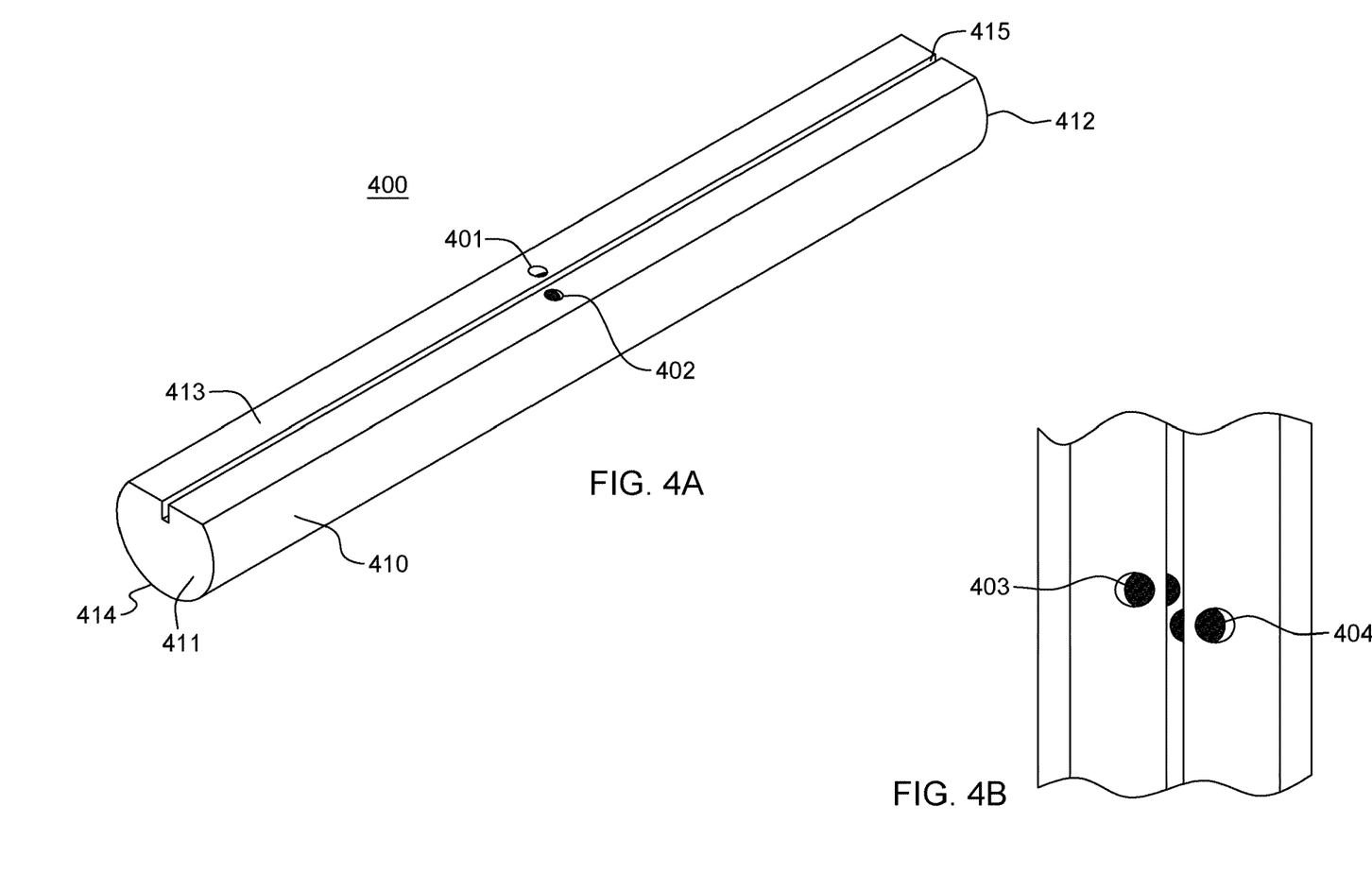
FIG. 4A depicts one embodiment of a tool to facilitate shaping contact tab interconnects at a circuit card edge, in accordance with one or more aspects of the present invention.
FIG. 4B is an enlarged partial depiction of the tool of FIG. 4A, in accordance with one or more aspects of the present invention.
Figures 4C, 4D:
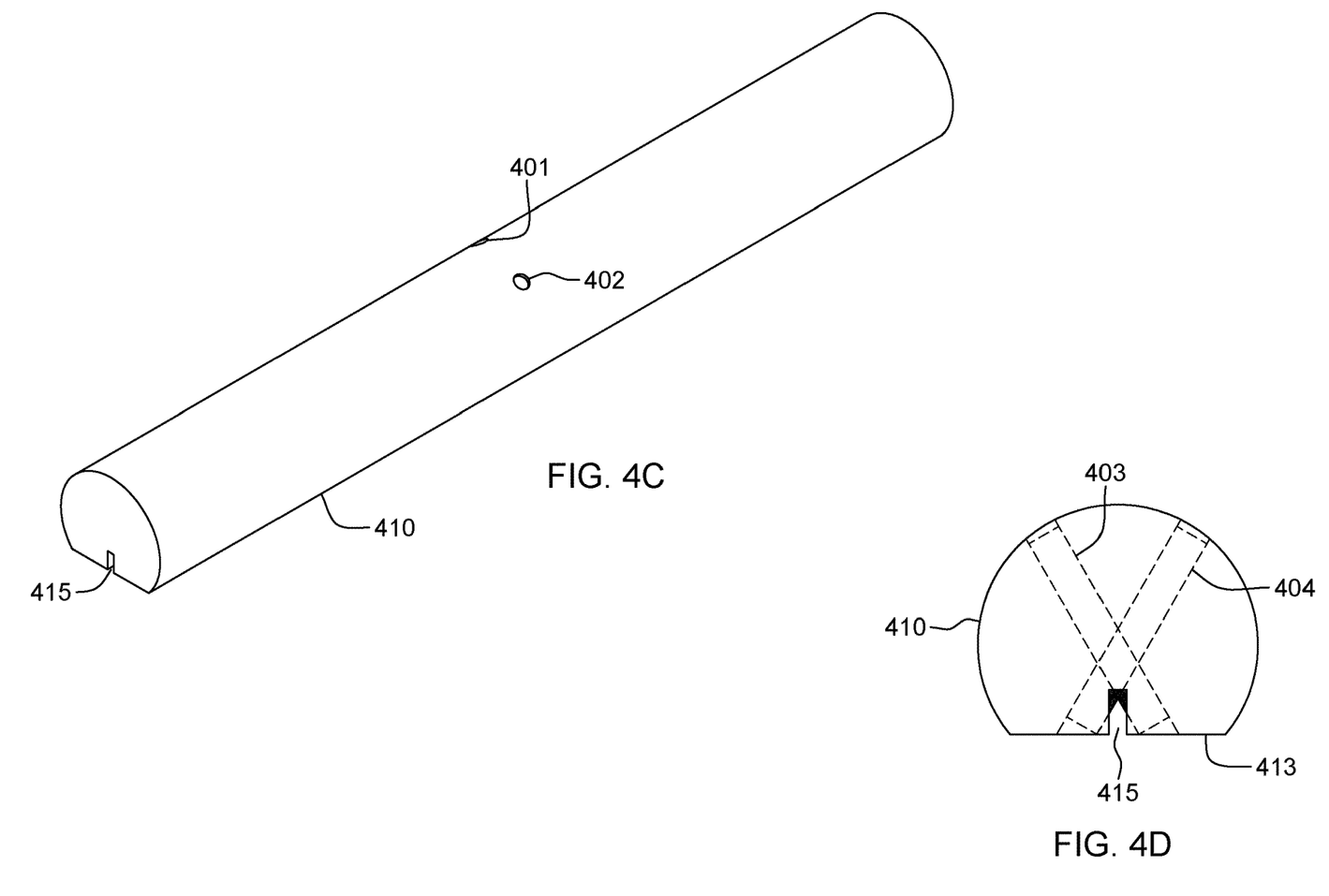
FIG. 4C is a reverse depiction of the shaping tool of FIGS. 4A & 4B, in accordance with one or more aspects of the present invention.
FIG. 4D is an end elevational view of the shaping tool of FIGS. 4A-4C, in accordance with one or more aspects of the present invention.

In one or more embodiments, base member 410 of tool 400 includes appropriately shaped openings 401, 402 extending into the base member to receive a respective shaping dowel 403, 404 at an angle within base member 410, such as depicted in FIG. 4D. Note that openings 401, 402 can extend fully through or partially into base member 410, depending on the implementation. In the embodiment of FIGS. 4A-4D, openings 401, 402 extend through base member 410, and are sized for the shaping dowels to be press-fit into the openings (in one embodiment).

As illustrated in FIG. 4D, shaping dowels 403, 404, which can be formed of any appropriate material (such as steel), are oriented at an angle relative to each other, with (in one embodiment) each shaping dowel extending into base member 410 at approximately 60° from flat upper surface 413 in a different direction. Note that two shaping dowels 403, 404 are shown by way of example only. Three or more shaping dowels could be provided in other implementations of tool 400. In the embodiment depicted, shaping dowels 403, 404 are located in close proximity to each other, and if desired, can be in contact. By locating two or more of the shaping dowels as depicted, either contacting or in close proximity, the shaping dowels facilitate capturing and guiding the circuit card edge as it crosses the dowels. Note that in FIG. 4D, a portion of each shaping dowel is exposed within slot 415 so as to be in direct contact with the circuit card edge as the circuit card edge is slid lengthwise through slot 415. This action results in burnishing or shaping of the ends of the contact tab interconnects at the circuit card edge. As noted, by providing the shaping dowels at different angles as depicted in FIGS. 4A-4D, sliding of a circuit card with contact tab interconnects on opposite sides of the card results in simultaneous shaping or rounding of the interconnects on the opposite sides in different directions, that is, each inward towards a lengthwise center-line of the circuit card edge.

FIGS. 5A-5D illustrate use of tool 400 to facilitate shaping contact tab interconnects extending to a circuit card edge, in accordance with one or more aspects of the present invention.

Figure 5A:
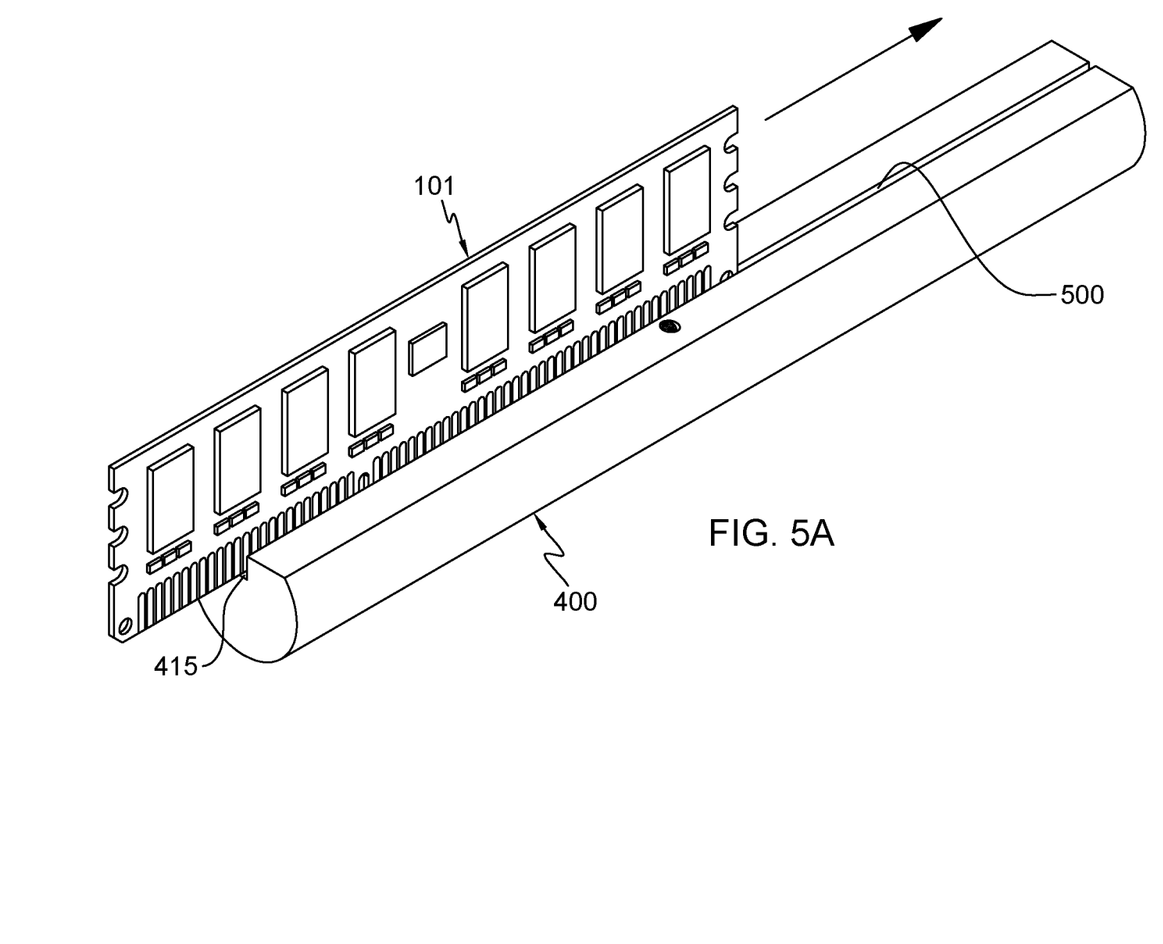
FIG. 5A depicts the tool embodiment of FIGS. 4A-4D in operative use to burnish the circuit card edge and shape contact tab interconnects, in accordance with one or more aspects of the present invention.
Figure 5B:
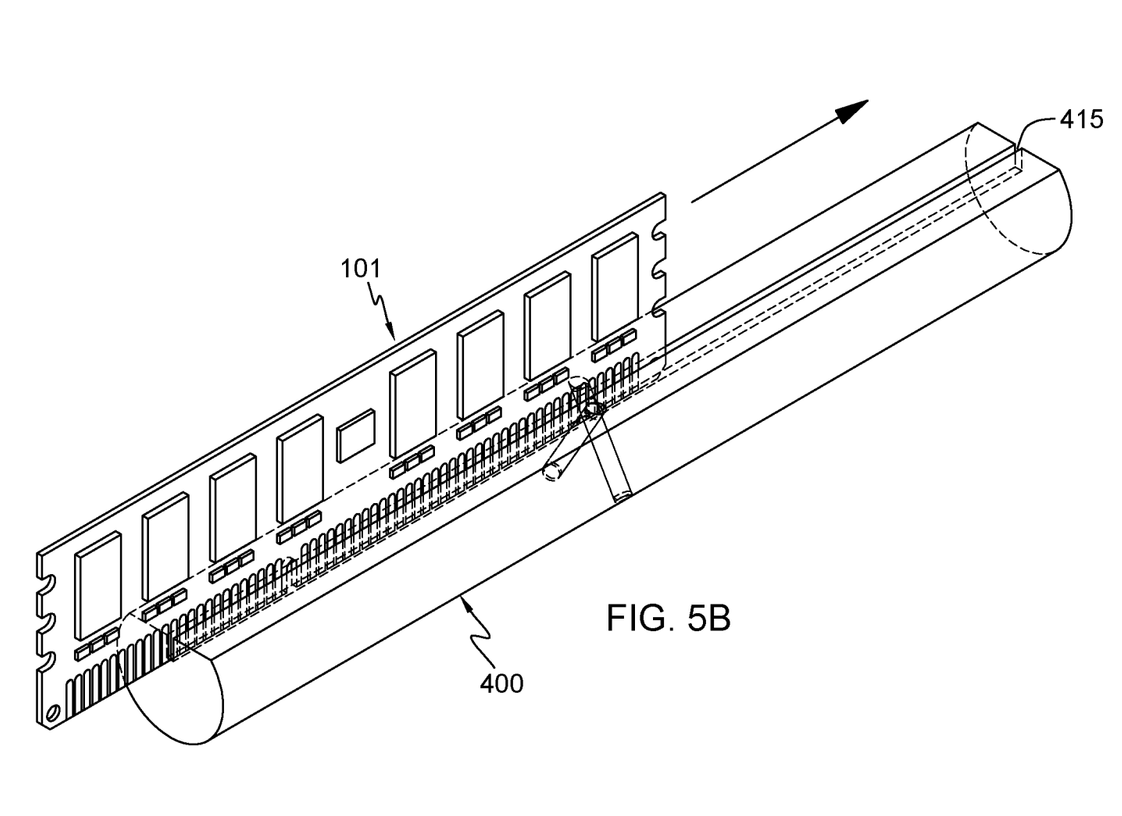
FIG. 5B is a schematic depiction of use of the tool of FIG. 5A to shape contact tab interconnects extending to the circuit card edge, in accordance with one or more aspects of the present invention.
Figure 5C:
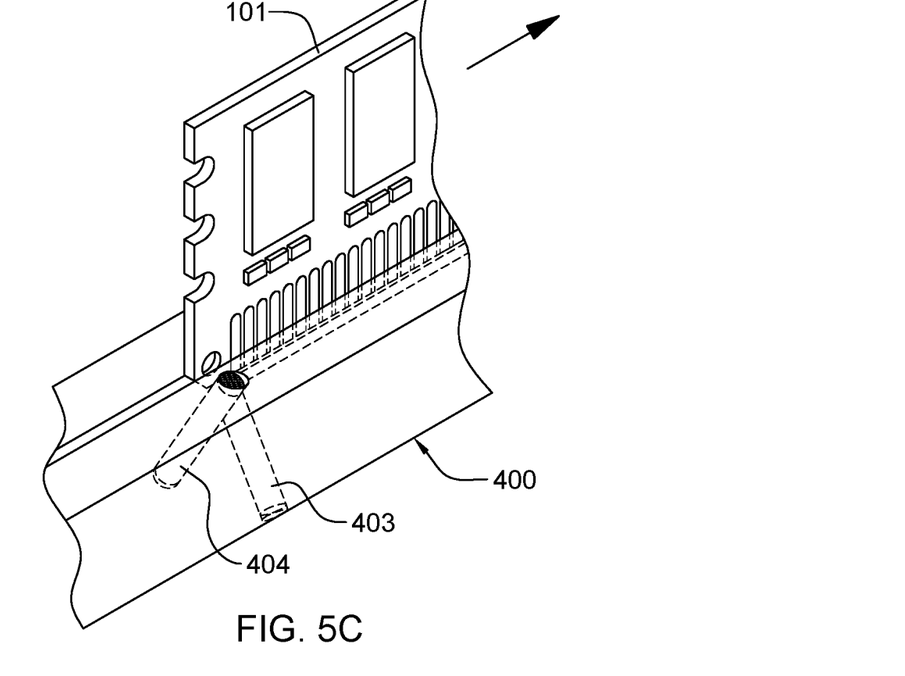
FIG. 5C depicts the circuit card edge and contact tab interconnects of the circuit card contacting and sliding across a pair of shaping dowels of the tool, in accordance with one or more aspects of the present invention.
Figure 5D:
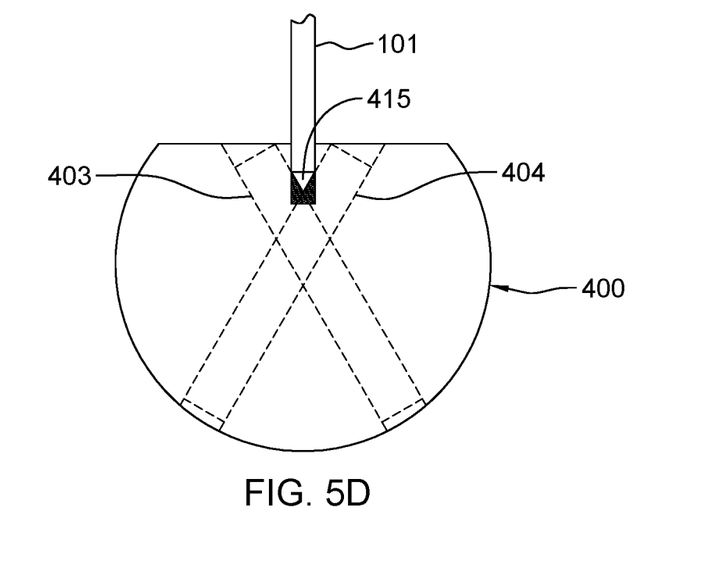
FIG. 5D is an end elevational view of the circuit card and tool of FIGS. 5A-5C, showing the pair of shaping dowels contacting opposite sides of the circuit card edge when operatively used to shape contact tab interconnects, in accordance with one or more aspects of the present invention.

Referring collectively to FIGS. 5A-5D, tool 400 is, in one or more implementations, sized and configured as a hand-held tool which can be held in one hand by an operator, who is holding in the other hand the circuit card to be burnished. The circuit card is inserted into slot 415 of tool 400 and slid lengthwise within slot 415 so as to pass across shaping dowels 403, 404 of the set of adjacent shaping dowels positioned within the base member of the tool. This is depicted in FIGS. 5C & 5D. When sliding circuit card 101 within slot 415 of tool 400, pressure can be applied to facilitate shaping the contact tab interconnects at the edge of the circuit card, as explained herein. Circuit card 101 is shown in contact with portions of the shaping dowels 403, 404 in FIG. 5D. Note that the depth and width of slot 415 can be relatively small with reference to the width and height of the circuit card, with appropriate tolerances being provided. As noted, tool 400 is configured and used to facilitate shaping or burnishing the contact tabs extending to the edge of the circuit card, and for this, only a centimeter or less of the circuit card might extend into slot 415 of the tool.

Figure 6A:
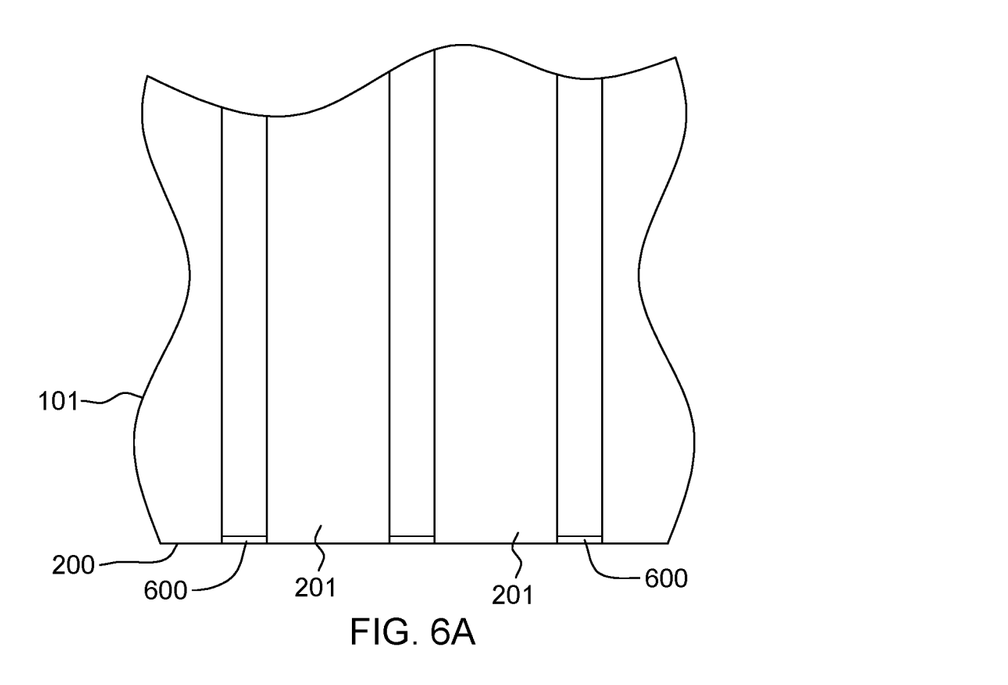
FIG. 6A is an enlarged partial depiction of a circuit card edge and contact tab interconnects extending to the edge of the circuit card that are to be shaped using a tool, in accordance with one or more aspects of the present invention.
Figure 6B:
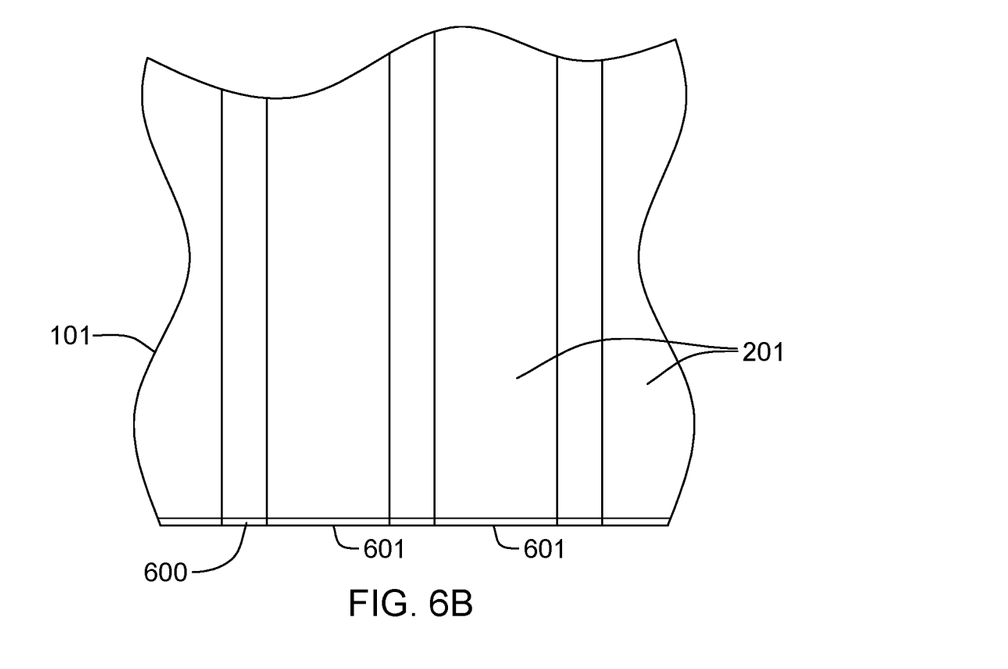
FIG. 6B depicts the circuit card edge of FIG. 6A after shaping the contact tab interconnects using a tool, in accordance with one or more aspects of the present invention.

FIGS. 6A & 6B depict one embodiment of a circuit card 101 before and after use of the tool, in accordance with one or more aspects of the present invention.

In FIG. 6A, contact tabs 201 are shown to extend downward from the bottom edge 200 of circuit card 101, notwithstanding the presence of a chamfer 600 at the bottom edge. In FIG. 6B, after use of the tool, contact tab interconnects 201 are shown rounded off, such that the ends 601 are chamfered or rounded at the edge of circuit card 101, which facilitates insertion of the circuit card into the socket or connector for which the card is designed without causing damage to the connector contacts.

Figure 7:
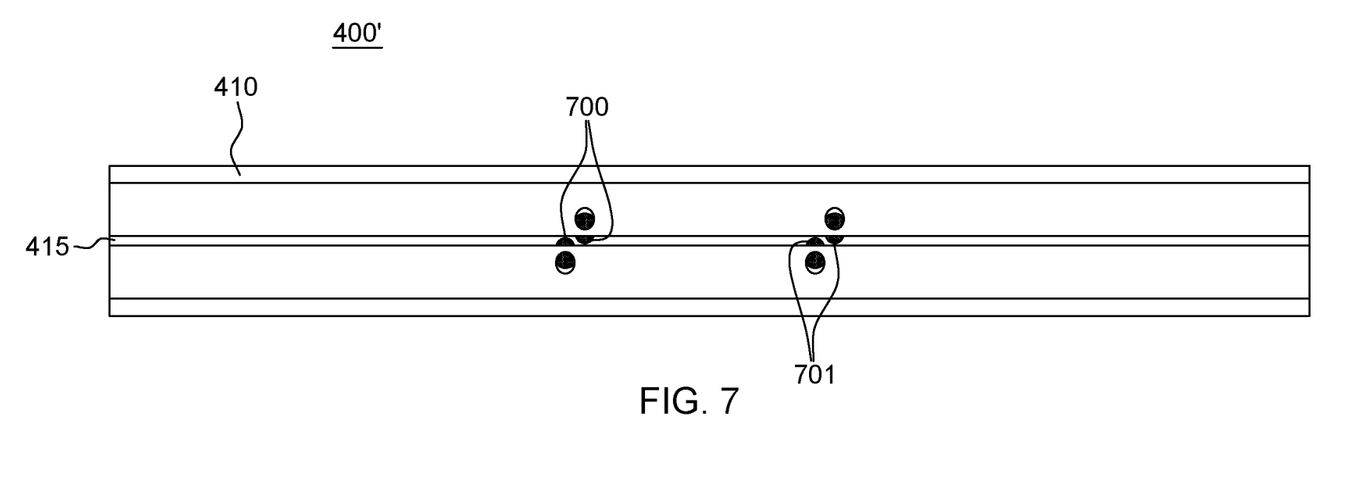
FIG. 7 is an alternate embodiment of a tool to facilitate shaping contact tab interconnects at a circuit card edge, in accordance with one or more aspects of the present invention.

FIG. 7 depicts an alternate embodiment of a tool 400', which is similar to tool 400 described above in connection with FIGS. 4A-5D. An exception is that two pairs of adjacent shaping dowels 700, 701 are shown at least partially exposed within slot 415 of base member 410. In particular, a first pair of shaping dowels 700 and a second pair of shaping dowels 701 are shown, by way of example. These shaping dowels could be similarly configured. Alternatively, the pairs of dowels could be configured differently with, for instance, different orientation angles relative to each other, and relative to the circuit card edge being slid through the tool. For instance, the first pair of shaping dowels 700 could be oriented at a first angle relative to each other, and the second pair of shaping dowels 701 oriented at a different, second angle relative to each other. In this case, sliding the circuit card from, for instance, the leftmost edge to the rightmost edge of the tool, could result in a stepwise rounding off of the contact tab interconnects extending to the edge of the circuit card.

Note that numerous variations on the above-described tool(s) can also be implemented. For instance, the shape of the dowels could change as desired for a particular application. Further, the number of dowels, and the materials the dowels are made of can vary, depending on the application, and the desired results. Multiple sets of adjacent dowels could be used in the same tool if, for instance, stepwise shaping of the contact tabs at the circuit card edge is desired. For instance, the shaping or forming could be performed at a first set of adjacent shaping dowels, and then finished at a second, third, or more, set of adjacent shaping dowels. Further, the angle or degree that the dowels extend into the tool can vary as desired for a particular application.

Advantageously, disclosed herein are a tool and a method of use, where contact tab interconnects can be shaped or burnished to a desired chamfer prior to insertion of the circuit card into an appropriate socket or connector, which might have multiple respective spring-biased contacts to engage the contact tab interconnects. Advantageously, the tooling can be used locally, with minimal cost in order to correct, for instance, a fabrication issue with one or more circuit cards to be used within a system. In one or more implementations, the shaping or burnishing dowels can be interchanged with different hardened materials to accommodate interconnects with different metal platings, for instance, either gold or palladium plating, and different printed circuit board material properties. Further, additional circuit card guides, rails, and/or multiple sets or pairs of shaping dowels could be provided within the tool to facilitate alignment of the circuit card edge with the shaping dowels as the circuit card is slid across the shaping dowels.

In one or more implementations, the slot or trench in the tool can be loaded with a lubricant or a corrosion inhibitor. The lubricant or corrosion inhibitor could aid in plugging, and/or extend reliability of the connection interface. Advantageously, the lubricant and/or corrosion inhibitor could be added to the slot or channel in the tool, with the lubricant and/or inhibitor being applied to the contact tabs commensurate with forming or shaping the contact tab interconnects at the edge of the circuit card, thereby eliminating a step in the fabrication process.

Further, the tool can be implemented as a hand-held tool, or as a tool as part of a fixture, if desired. The hand-held tool implementation advantageously is mobile and can provide greater flexibility in use.

As noted, in one or more embodiments, disclosed herein is a method or process of shaping contact tab interconnects extending to a circuit card edge. The method can include using a tool in shaping the contact tabs at the circuit card edge, where the tool includes a base member with a slot to receive an edge of a circuit card, and shaping dowels disposed within the base member. The slot is sized such that the edge of the circuit card is slidable lengthwise within the slot, and the circuit card includes contact tab interconnects extending to the edge on at least one side of the circuit card. The shaping dowels can include at least two shaping dowels that define a set of adjacent shaping dowels extending at an angle relative to each other. The set of adjacent shaping dowels are exposed, at least in part, within the slot in the base member. Using the tool further includes placing the edge of the circuit card within the slot in the base member of the tool, and applying pressure to the circuit card while sliding the circuit card lengthwise within the slot so that the edge of the circuit card contacts and slides across the shaping dowels to round off, at least in part, ends of the contact tab interconnects at the edge of the circuit card.

More particularly, in one or more embodiments, the process can include selecting a circuit card, such as a metal-plated, tabbed circuit card, and holding the tool in one hand with the slot face of the tool facing upward. The card is held firmly in the other hand, with the metal plating tabs extending downward. The edge of the card with the metal plating tabs is inserted into the tool slot such that the card edge is to contact and slide across the shaping dowels within the tool. In one or more implementations, the shaping dowels are disposed near the center of the tool. However, the location of the dowels can vary depending on the implementation, as well as the number of dowels. Moderate pressure is applied downward, and the tabs are slid over the shaping dowels in one continuous motion. Visual inspection of the contact tabs on the card can be done to ensure that there is no visible damage, and verify that the shaping is complete. If needed, the process can be repeated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tool to facilitate shaping contact tab interconnects at a circuit card edge, the tool comprising:
    a base member with a slot to receive an edge of a circuit card, the slot being sized such that the edge of the circuit card is slidable lengthwise within the slot, and the circuit card includes contact tab interconnects at the edge on at least one side of the circuit card; and
    shaping dowels disposed within the base member, and including at least two shaping rods that define a set of adjacent shaping rods oriented in different directions and extending within the base member at an angle relative to each other, the set of adjacent shaping rods being exposed, at least in part, within the slot in the base member so that with lengthwise sliding of the edge of the circuit card within the slot of the base member, the edge of the circuit card contacts and slides across the set of adjacent shaping rods rounding off, at least in part, ends of the contact tab interconnects at the edge of the circuit card.

2. The tool of claim 1, wherein the shaping rods of the set of adjacent shaping rods are oriented within the base member so that in operational use of the tool, with lengthwise sliding of the edge of the circuit card within the slot of the base member across the set of adjacent shaping rods, the set of adjacent shaping rods facilitate chamfering the contact tab interconnects at the edge of the circuit card.

3. The tool of claim 1, wherein the shaping rods of the set of adjacent shaping rods each have a smooth surface exposed within the slot in the base member.

4. The tool of claim 1, wherein the at least two shaping rods of the set of adjacent shaping rods are in physical contact with each other.

5. The tool of claim 1, wherein shaping rods of the set of adjacent shaping rods are positioned and oriented such that a first shaping rod of the set of adjacent shaping rods contacts the edge of the circuit card at a first side of the circuit card with lengthwise sliding of the edge of the circuit card within the slot in the base member, and a second shaping rod of the set of adjacent shaping rods contacts the edge of the circuit card at a second side of the circuit card with lengthwise sliding of the edge of the circuit card within the slot in the base member, where the first side and the second side are opposite sides of the circuit card.

6. The tool of claim 1, wherein the base member is an elongate structure with a length greater than a length of the circuit card.

7. The tool of claim 6, wherein the base member has a flat upper surface and a curved lower surface, the slot being disposed in the flat upper surface of the base member.

8. The tool of claim 1, wherein the base member is sized and configured to be held by hand when the tool is in use, the tool being a hand-held tool.

9. A tool to facilitate shaping contact tab interconnects at a circuit card edge, the tool comprising:
    a base member with a slot to receive an edge of a circuit card, the slot being sized such that the edge of the circuit card is slidable lengthwise within the slot, and the circuit card includes contact tab interconnects extending to the edge on at least one side of the circuit card;
    shaping dowels disposed within the base member, and including at least two shaping dowels that define a set of adjacent shaping dowels extending at an angle relative to each other, the set of adjacent shaping dowels being exposed, at least in part, within the slot in the base member, wherein, in operation, with lengthwise sliding of the edge of the circuit card within the slot of the base member, the edge of the circuit card contacts and slides across the set of adjacent shaping dowels to round off, at least in part, ends of the contact tab interconnects at the edge of the circuit card; and
    wherein the at least two shaping dowels of the set of adjacent shaping dowels are cylindrical rods oriented in different directions within the base member.

10. A tool to facilitate shaping contact tab interconnects at a circuit card edge, the tool comprising:
    a base member with a slot to receive an edge of a circuit card, the slot being sized such that the edge of the circuit card is slidable lengthwise within the slot, and the circuit card includes contact tab interconnects extending to the edge on at least one side of the circuit card;
    shaping dowels disposed within the base member, and including at least two shaping dowels that define a set of adjacent shaping dowels extending at an angle relative to each other, the set of adjacent shaping dowels being exposed, at least in part, within the slot in the base member, wherein, in operation, with lengthwise sliding of the edge of the circuit card within the slot of the base member, the edge of the circuit card contacts and slides across the set of adjacent shaping dowels to round off, at least in part, ends of the contact tab interconnects at the edge of the circuit card; and
    wherein the shaping dowels disposed within the base member comprise a first pair of adjacent shaping dowels and a second pair of adjacent shaping dowels, the first pair of adjacent shaping dowels comprising shaping dowels disposed at a first angle relative to each other, and the second pair of adjacent shaping dowels comprising shaping dowels disposed at a second angle relative to each other, wherein the first angle and the second angle are different angles.

* * * * *